(12) United States Patent
Fujii et al.

(10) Patent No.: US 7,977,853 B2
(45) Date of Patent: Jul. 12, 2011

(54) PIEZOELECTRIC DEVICE, AND LIQUID DISCHARGE DEVICE USING THE PIEZOELECTRIC DEVICE

(75) Inventors: Takamichi Fujii, Kanagawa-ken (JP); Takayuki Naono, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 235 days.

(21) Appl. No.: 12/195,150

(22) Filed: Aug. 20, 2008

(65) Prior Publication Data
US 2009/0072673 A1 Mar. 19, 2009

(30) Foreign Application Priority Data
Aug. 21, 2007 (JP) .................. 2007-214667

(51) Int. Cl.
H01L 41/16 (2006.01)
(52) U.S. Cl. ............ 310/358; 252/62.9 R; 252/62.9 PZ; 257/347; 501/134
(58) Field of Classification Search .................. 310/358; 252/62.9 R, 62.9 PZ; 257/347; 501/134
See application file for complete search history.

(56) References Cited

U.S. PATENT DOCUMENTS

| | | | |
|---|---|---|---|
| 5,160,869 A * | 11/1992 | Nakahata et al. | 310/313 A |
| 6,402,303 B1 | 6/2002 | Sumi | |
| 6,402,304 B1 | 6/2002 | Qiu et al. | |
| 6,711,793 B2 | 3/2004 | Sumi | |
| 7,145,285 B2 * | 12/2006 | Torii et al. | 310/358 |
| 7,399,067 B2 * | 7/2008 | Kubota et al. | 347/70 |
| 2004/0183029 A1 * | 9/2004 | Honda et al. | 250/484.4 |
| 2005/0067585 A1 * | 3/2005 | Kudo et al. | 250/484.4 |
| 2006/0244770 A1 * | 11/2006 | Nishijima | 347/1 |

FOREIGN PATENT DOCUMENTS

| | | | |
|---|---|---|---|
| JP | 37-5089 | | 6/1962 |
| JP | 2000-52559 | A | 2/2000 |
| JP | 2000-79689 | A | 3/2000 |
| JP | 2002-43643 | A | 2/2002 |
| JP | 2002-84012 | A | 3/2002 |
| JP | 2003119075 | * | 4/2003 |

OTHER PUBLICATIONS

Office Action issued in Chinese Patent Application No. 200810130877.7 on Apr. 2, 2011.

* cited by examiner

*Primary Examiner* — Thomas M Dougherty
*Assistant Examiner* — Bryan P Gordon
(74) *Attorney, Agent, or Firm* — Birch, Stewart, Kolasch & Birch, LLP

(57) ABSTRACT

A piezoelectric device having a piezoelectric film formed over a substrate through an electrode by vapor phase deposition using plasma, and constituted by columnar crystals of one or more perovskite oxides $Pb(Ti_x, Zr_y, M_z)O_3$ ($0<x<1$, $0<y<1$, $0\leq z<1$, $x+y+z=1$) which extend nonparallel to the substrate. M represents one or more of Sn, Nb, Ta, Mo, W, Ir, Os, Pd, Pt, Re, Mn, Co, Ni, V, and Fe. The maximum diameters of the end faces of the columnar crystals are distributed from a value not exceeding 100 nm to a value of 500 nm or greater. The arithmetic average surface roughness of the columnar film is 10 nm or smaller, 20% or more of the columnar crystals have the maximum diameters not exceeding 100 nm, and 5% or more of the columnar crystals have the maximum diameters of 500 nm or greater.

6 Claims, 10 Drawing Sheets

PIEZOELECTRIC DEVICE, AND LIQUID DISCHARGE DEVICE USING THE PIEZOELECTRIC DEVICE

BACKGROUND OF THE INVENTION

1. Field of the Intention

The present invention relates to a piezoelectric device in which a piezoelectric film is formed over a substrate through an electrode by vapor phase deposition using plasma. The present invention also relates to a liquid discharge device using such a piezoelectric device.

2. Description of the Related Art

Currently, piezoelectric devices constituted by a piezoelectric film and electrodes are used, for example, as actuators installed in inkjet recording heads, and the like. In the piezoelectric devices, the piezoelectric film expands and contracts in correspondence with increase and decrease in the strength of an electric field which is applied from the electrodes to the piezoelectric film. In addition, size reduction and performance improvement in various electronic devices are currently demanded. For example, in the field of the inkjet recording heads, size reduction in piezoelectric devices is required so as to enable high-density mounting of the piezoelectric devices for improving image quality.

When the size of the piezoelectric devices is reduced, from the viewpoint of precision in machining and processing, it is considered preferable that the piezoelectric film in each piezoelectric device have the smallest possible thickness and exhibit satisfactory piezoelectric performance. However, when the thickness of the piezoelectric film obtained by the conventional sintering technique is reduced and approaches the size of the crystalline grains constituting the piezoelectric film, the influence of the dimensions and the shapes of the crystalline grains on the piezoelectric performance becomes unignorable. Therefore, the piezoelectric performance is likely to vary and deteriorate, and it is difficult to achieve sufficient performance. In order to avoid the influence of the crystalline grains as above, use of vapor phase deposition such as sputtering or PVD (physical vapor deposition), instead of the sintering technique, is currently under study as a thin-film formation technique for production of a thin piezoelectric film.

Nevertheless, even in the case where a thin piezoelectric film is produced by vapor phase deposition, the piezoelectric performance of the thin piezoelectric film tore greatly varies than the piezoelectric performance of the bulk sintered piezoelectric body, so that it is difficult to produce a piezoelectric film having sufficient piezoelectric performance. Therefore, some attempts to solve this problem, including an attempt to optimize the crystal structure, are currently being made.

Registered Japanese Patent No. 3705089 (hereinafter referred to as JP3705089) discloses a piezoelectric device having a lead-containing piezoelectric film constituted by crystalline grains, where the greater part of the crystalline grains have a columnar structure and composition which continuously or progressively varies along the thickness direction.

U.S. Pat. No. 7,145,285 (hereinafter referred to as U.S. Pat. No. 7,145,285) discloses a piezoelectric device having a two-layer laminated piezoelectric film and an orientation control layer which underlies the piezoelectric film and has satisfactory adhesiveness to a lower electrode.

Although JP3705089 reports that the piezoelectric device disclosed in JP3705089 has satisfactory piezoelectric characteristics and can be formed in small size, the film-formation process used in production of the piezoelectric device is complex. For example, precise control of applied voltage is performed for realizing the variations in the composition of the piezoelectric film along the thickness direction.

On the other hand, U.S. Pat. No. 7,145,285 reports that the piezoelectric device disclosed in U.S. Pat. No. 7,145,285 exhibits high piezoelectric performance and durability due to the provision of the orientation control layer. However, since the piezoelectric film has the two-layer structure, it is necessary to change the target composition and the film-formation condition, That is, the process for producing the piezoelectric device disclosed in U.S. Pat. No. 7,145,285 is complex.

SUMMARY OF THE INVENTION

The present invention has been made in view of the above circumstances.

The first object of the present invention is to provide a piezoelectric device in which a piezoelectric film is formed over a substrate through an electrode by vapor phase deposition using plasma, and which exhibits satisfactory piezoelectric characteristics and can be produced by a simple process.

The second object of the present invention is to provide a liquid discharge device using the piezoelectric device which achieves the first object.

(I) In order to accomplish the first object, according to the first aspect of the present invention, a piezoelectric device in which a piezoelectric film is formed over a substrate through an electrode by vapor phase deposition using plasma is provided. The piezoelectric device comprises a substrate, an electrode formed over a surface of the substrate, and a piezoelectric film formed over the surface of the substrate through the electrode by vapor phase deposition using plasma. The piezoelectric device is characterized in that the piezoelectric film is a columnar film constituted by a plurality of columnar crystals which are composed of one or more perovskite oxides (and inevitable impurities), and extend nonparallel to the surface of the substrate, each of the one or more perovskite oxides is expressed by a compositional formula $Pb(Ti_x, Zr_y, M_z)O_3$, and M in the compositional formula represents one or more of the metal elements Sn, Nb, Ta, Mo, W, Ir, Os, Pd, Pt, Re, Mn, Co, Ni, V, and Fe, where $0<x<1$, $0<y<1$, $0\leq z<1$, and $x+y+z=1$. In addition, the plurality of columnar crystals have end faces at a surface of the columnar film, and the diameters of the minimum circumscribed circles of the end faces are distributed over a range from a value not exceeding 100 nm to a value of 500 nm or greater, 20% or more of the plurality of columnar crystals have end faces with the diameters of the minimum circumscribed circles not exceeding 100 nm, 5% or more of the plurality of columnar crystals have end faces with the diameters of the minimum circumscribed circles of 500 nm or greater, and the columnar film has an arithmetic average surface roughness Ra of 10 nm or smaller.

In the compositional formula $Pb(Ti_x, Zr_y, M_z)O_3$, Pb is the A-site element, and Ti, Zr, and M are B-site elements. Although the ratio of each of the molar amount of the atoms of lead (Pb) as the A-site element and the total molar amount of the atoms of the B-site elements to the molar amount of the oxygen atoms in each of the one or more perovskite oxides is normally 1:3, the ratio may deviate from 1:3 within a range in which a perovskite structure can be formed. That is, although $x+y+z$ is normally equal to one, $x+y+z$ may deviate from one within a range in which a perovskite structure can be formed.

It is preferable that the piezoelectric film be formed at the film-formation temperature lower than 550° C. by the vapor phase deposition. In addition, it is also preferable that the ferroelectric film be formed under a condition that the difference Vs–Vf between the plasma potential Vs in plasma generated during formation of the piezoelectric film and the floating potential Vf in the plasma generated during the formation of the piezoelectric film is in the range of 10 V to 30 V.

In this specification, the film-formation temperature is the temperature of the center of the substrate over which the piezoelectric film is formed.

In addition, it is preferable that the vapor phase deposition be realized by one of sputtering, ion plating, and plasma CVD (chemical vapor deposition).

Further, it is preferable that the piezoelectric film have a thickness of 1 micrometer or greater.

(II) In order to accomplish the second object, according to the second aspect of the present invention, a liquid discharge device is provided. The liquid discharge device comprises the piezoelectric device according to the first aspect of the present invention; and a discharge member which is formed integrally with or separately from the substrate in the piezoelectric device. The discharge member includes a liquid-reserve chamber which reserves liquid, and a liquid-discharge outlet through which the liquid is externally discharged from the liquid-reserve chamber.

(III) The advantages of the present invention are explained below.

In the piezoelectric device, the piezoelectric film is formed by the vapor phase deposition using plasma, and is a columnar film composed of one or more PZT (lead zirconate titanate)-based perovskite oxides expressed by the compositional formula $Pb(Ti_x, Zr_y, M_z)O_3$, the diameters of the minimum circumscribed circles of the end faces (observed at the surface of the piezoelectric film) are distributed from a value not exceeding 100 nm to a value of 500 nm or greater, 20% or more of the plurality of columnar crystals have end faces with the diameters of the minimum circumscribed circles not exceeding 100 nm, 5% or more of the plurality of columnar crystals have end faces with the diameters of the minimum circumscribed circles of 500 nm or greater, and the columnar film has an arithmetic average surface roughness Ra of 10 nm or smaller.

Since the surface roughness of the piezoelectric film is small, the electric fields are unlikely to concentrate, so that it is possible to suppress deterioration of the piezoelectric film, which can be caused by concentration of electric fields. In addition, since the small arithmetic average surface roughness Ra increases the precision in the patterning, which is performed in a later stage for completing the device, it is possible to improve the uniformity of the actuation over the entire area of the piezoelectric film.

Further, in the piezoelectric film in the piezoelectric device according to the present invention, the diameters of the crystalline grains are widely distributed, and the crystalline grains constituting the entire piezoelectric film have irregular shapes. Although the piezoelectric performance of crystalline grains having great diameters are generally considered likely to be limited by in-plane stress and the like, the piezoelectric performance of the piezoelectric film in the piezoelectric device according to the present invention as a whole is not limited since the crystalline grains having small diameters are mixed with the crystalline grains having great diameters, and therefore the stress can be easily relaxed.

Furthermore, since the diameters of the crystalline grains constituting the piezoelectric film in the piezoelectric device according to the present invention are not uniform, the complex processes for producing the variations of the composition of the piezoelectric film along the thickness direction and arranging the orientation control layer are unnecessary.

Therefore, the piezoelectric device according to the present invention can be produced by vapor phase deposition using plasma, so that the piezoelectric device according to the present invention can be produced by a simple process, and exhibits high reliability and satisfactory piezoelectric performance.

DETAILED DESCRIPTION OF THE INVENTION

Preferred embodiments of the present invention are explained in detail below with reference to drawings.

1. PIEZOELECTRIC DEVICE AND INKJET RECORDING HEAD

Figure 1:
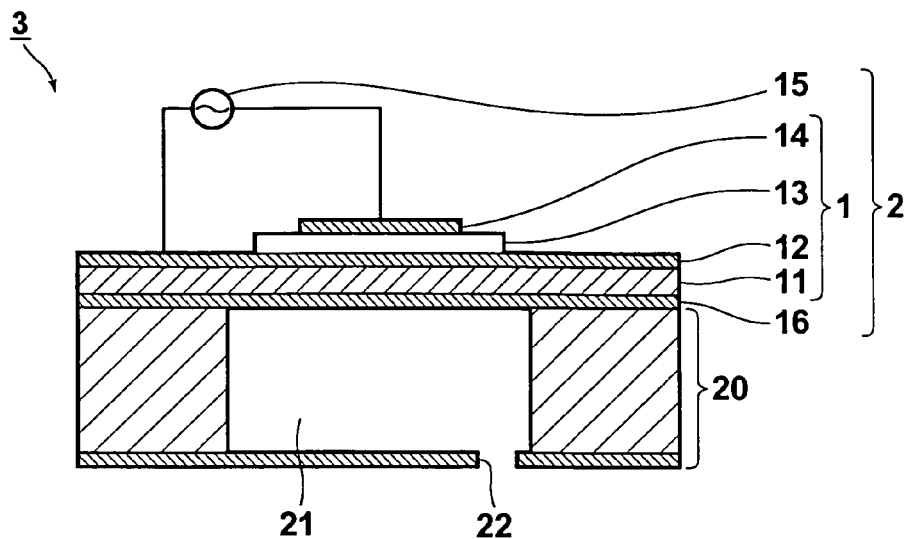
FIG. 1 is a cross-sectional view schematically illustrating a cross section of an essential portion of an inkjet recording head (as a liquid discharge device) having a piezoelectric device according to an embodiment of the present invention.

Hereinbelow, the structure of an inkjet recording head (as an embodiment of the liquid discharge device according to the second aspect of the present invention) containing a piezoelectric device (as an embodiment of the piezoelectric device according to the first aspect of the present invention) is explained with reference to FIG. 1, which is a cross-sectional view schematically illustrating a cross section (in the thickness direction) of an essential portion of the inkjet recording head. In FIG. 1, the dimensions of the illustrated elements are differentiated from the dimensions of the elements of the actual inkjet recording head for clarification.

In outline, the inkjet recording head 3 illustrated in FIG. 1 is constituted by a piezoelectric actuator 2 and an ink nozzle 20, and the piezoelectric actuator 2 is constituted by a piezoelectric device 1 and a diaphragm 16.

The piezoelectric device 1 is produced by forming on a substrate 11 a lower electrode 12, a piezoelectric film 13, and an upper electrode 14 in this order so that an electric field along the thickness direction can be applied to the piezoelectric film 13 through the lower electrode 12 and the upper electrode 14.

The piezoelectric actuator 2 is produced by attaching the diaphragm 16 to the back surface of the substrate 11 of the piezoelectric device 1 so that the diaphragm 16 can vibrate in correspondence with expansion and contraction of the piezoelectric film 13. In addition, the piezoelectric actuator 2 comprises a control means 15 (such as a driver circuit) for driving the piezoelectric device 1.

The inkjet recording head 3 is produced by attaching the ink nozzle 20 to the back surface of the piezoelectric actuator 2. The ink nozzle 20 is a member for reserving and discharging ink, and comprises an ink chamber 21 (as the liquid-reserve chamber) and an ink-discharge outlet 22 (as the liquid-discharge outlet). The ink chamber 21 reserves the ink, and the ink held in the ink chamber is discharged out of the ink chamber through the corresponding ink-discharge outlet.

In the above inkjet recording head 3, the strength of the electric field applied to the piezoelectric device 1 is increased or decreased so as to expand or contract the piezoelectric device 1 and control the discharge of the ink from the ink chamber 21 and the discharge amount of the ink.

Alternatively, it is possible to process portions of the substrate 11 into the diaphragm 16 and the ink nozzle 20, instead of separately preparing the diaphragm 16 and the ink nozzle 20 and attaching the diaphragm 16 and the ink nozzle 20 to the piezoelectric device 1. For example, the ink chamber 21 can be formed by etching a corresponding portion of the substrate 11 from the bottom surface of the substrate 11, and the diaphragm 16 and the structures of the ink nozzle 20 can be produced by machining or processing the substrate 11 per se.

The material (composition) of the substrate 11 is not specifically limited. For example, the substrate 11 may be made of silicon, glass, stainless steel (SUS), YSZ (yttrium stabilized zirconia), $SrTiO_3$, alumina, sapphire, silicon carbide, or the like. In addition, the substrate 11 may be realized by a laminated substrate such as the SOI (silicon-on-insulator) substrate, which is produced by alternately forming on a surface of a silicon substrate one or more oxide films of $SiO_2$ and one or more Si active layers. Further, it is possible to form between the substrate 11 and the lower electrode 12 a buffer layer for improving the lattice matching or an adhesion layer for improving adhesiveness of the lower electrode 12 to the substrate 11.

The main components of the lower electrode 12 and the upper electrode 14 are not specifically limited, and may be, for example, one or a combination of metals such as Au, Pt, and Ir, metal oxides such as $IrO_2$, $RuO_2$, $LaNiO_3$, and $SrRuO_3$, or one or a combination of nonmetals such as Cr, W, Ti, Al, Fe, Mo, In, Sn, Ni, Cu, Co, and Ta and alloys of the nonmetals.

Although the thicknesses of the lower electrode 12 and the upper electrode 14 are not specifically limited, it is preferable that each of the lower electrode 12 and the upper electrode 14 have a thickness of 50 to 500 nm.

The piezoelectric film 13 is composed of one or more perovskite oxides each of which is expressed by the compositional formula $Pb(Ti_x, Zr_y, M_z)O_3$, where M in the compositional formula represents one or more of the metal elements Sn, Nb, Ta, Mo, W, Ir, Os, Pd, Pt, Re, Mn, Co, Ni, V, and Fe, $0<x<1, 0<y<1, 0\leq z<1$, and $x+y+z=1$. (The piezoelectric film 13 may contain inevitable impurities.)

Specifically, each of the one or more perovskite oxides may be lead titanate, lead titanate zirconate (PZT), lead zirconate, lead titanate zirconate niobate, or the like.

The piezoelectric film 13 is formed over the substrate 11 through the lower electrode 12 by vapor phase deposition using plasma, and is a columnar film constituted by a great number of columnar crystals 17 which extend nonparallel to the surface of the substrate 11.

Figure 2A:
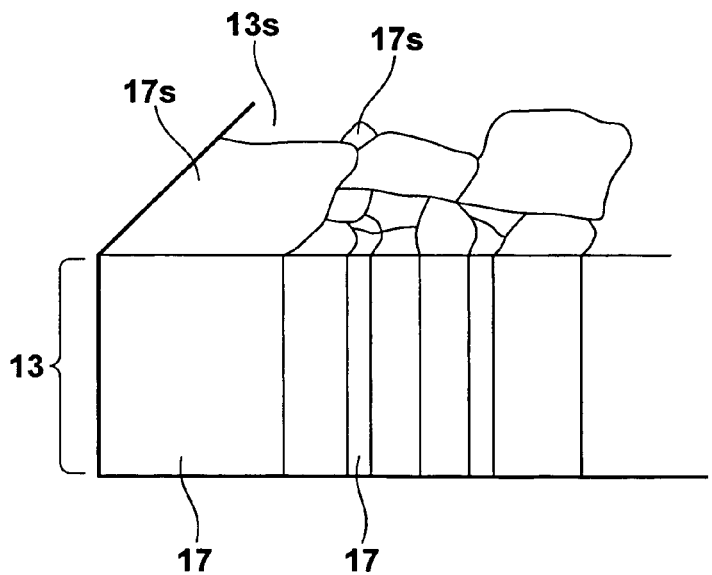
FIG. 2A is a magnified perspective view of a portion of a piezoelectric film according to the present invention, and illustrates the columnar structure of the piezoelectric film.
Figure 2B:
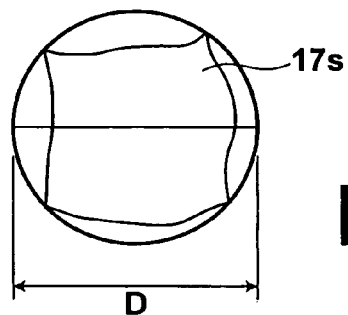
FIG. 2B is a diagram illustrating an end face of a columnar crystal at a surface of the piezoelectric film, and a circumscribed circle of the end face.
Figure 7:
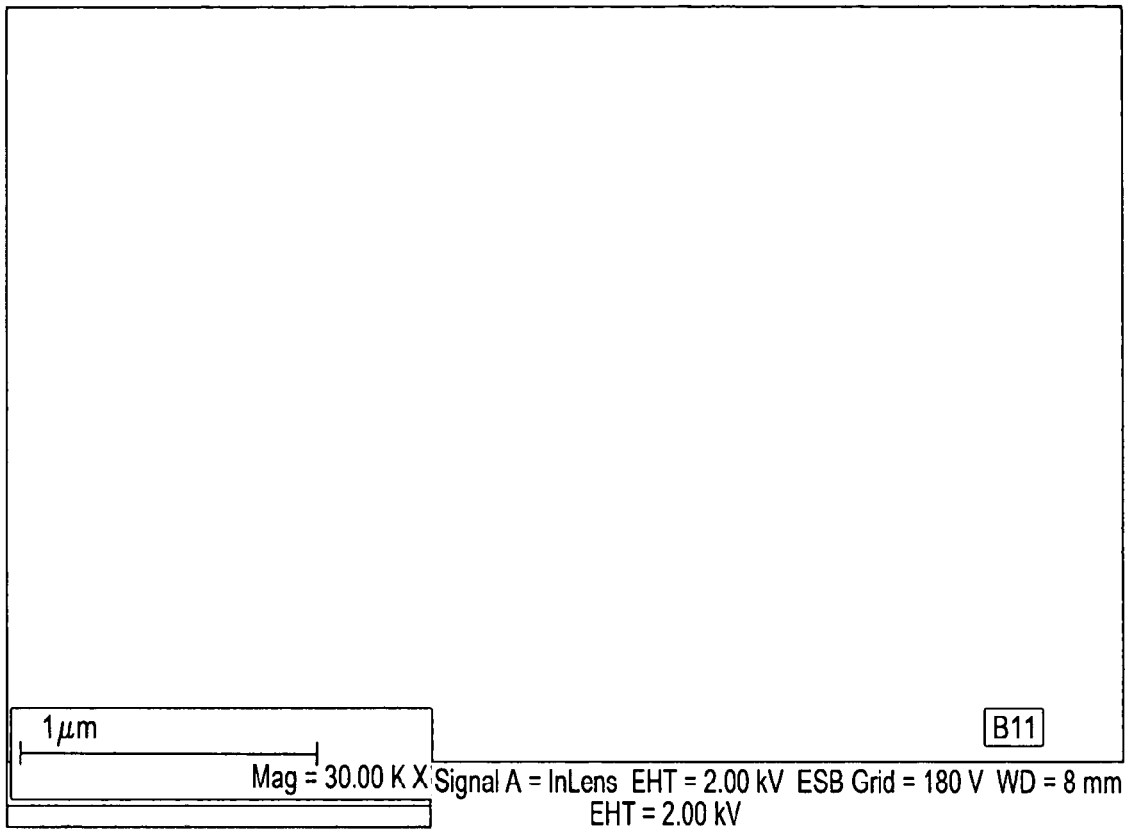
FIG. 7 is a surface SEM (Scanning Electron Microscope) micrograph of the piezoelectric film of FIG. 6.
Figure 8:
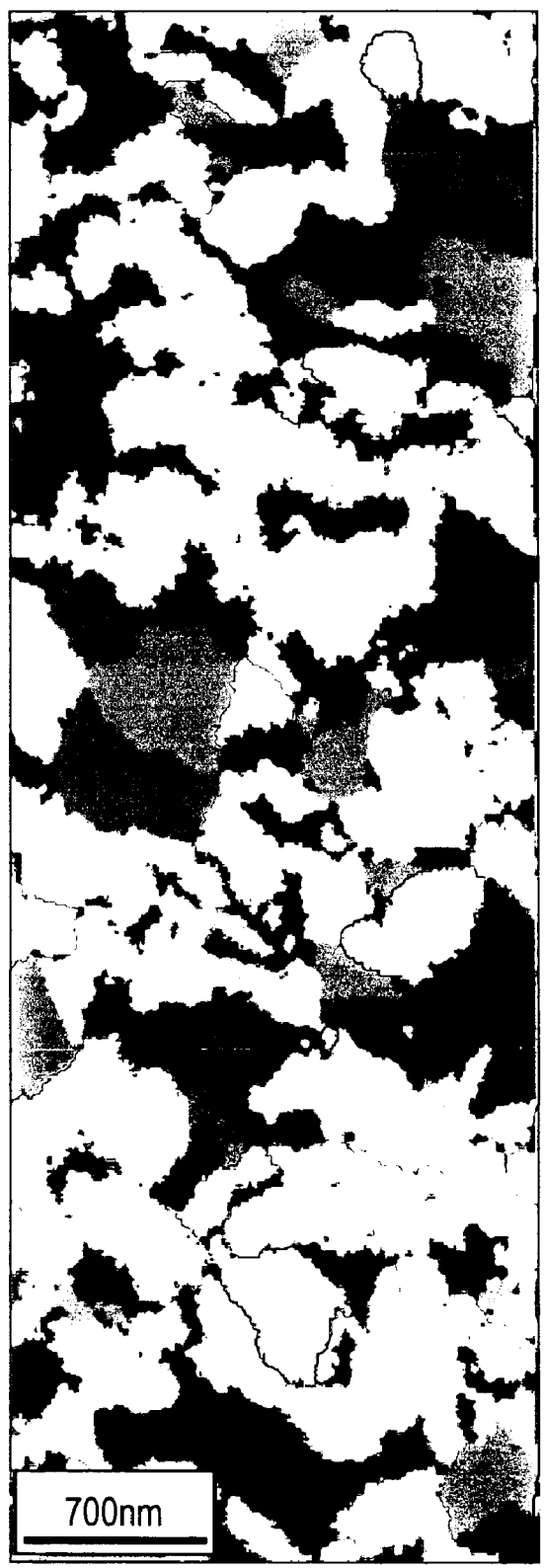
FIG. 8 is an image of crystalline grains at a surface of the piezoelectric film of FIG. 6, which is obtained by EBSD (Electron Backscatter Diffraction) measurement of the surface.

FIG. 2A is a magnified perspective view schematically illustrating a portion of the piezoelectric film 13, which has a columnar structure. The arithmetic average surface roughness Ra of the piezoelectric film (columnar film) 13 is 10 nm or smaller. In addition, the diameters D of the minimum circumscribed circles of the end faces of the columnar crystals 17 observed at the surface 13s of the piezoelectric film 13 are distributed over a range from a value not exceeding 100 nm to a value of 500 nm or greater, 20% or more of the columnar crystals 17 have end faces with the diameters of the minimum circumscribed circles not exceeding 100 nm, and 5% or more of the columnar crystals 17 have end faces with the diameters of the minimum circumscribed circles of 500 nm or greater. (FIG. 2B shows an end face 17s of one of the columnar crystals 17 observed at the surface 13s of the piezoelectric film 13, and the minimum circumscribed circle of the end face 17s. See also FIGS. 7 and 8 presented for the concrete example explained later.)

It is more preferable that the arithmetic average surface roughness Ra be smaller when the arithmetic average surface roughness Ra of the piezoelectric film is greater than 10 nm, some problems occur. For example, concentration of electric fields occurs during actuation, so that the durability of the piezoelectric device decreases. In addition, the precision in patterning decreases, so that the uniformity of the actuation over the entire area of the piezoelectric film decreases. Specifically, the arithmetic average surface roughness Ra of the piezoelectric film 13 is preferably 8 nm or smaller, and more preferably 6 nm or smaller.

Figure 14:
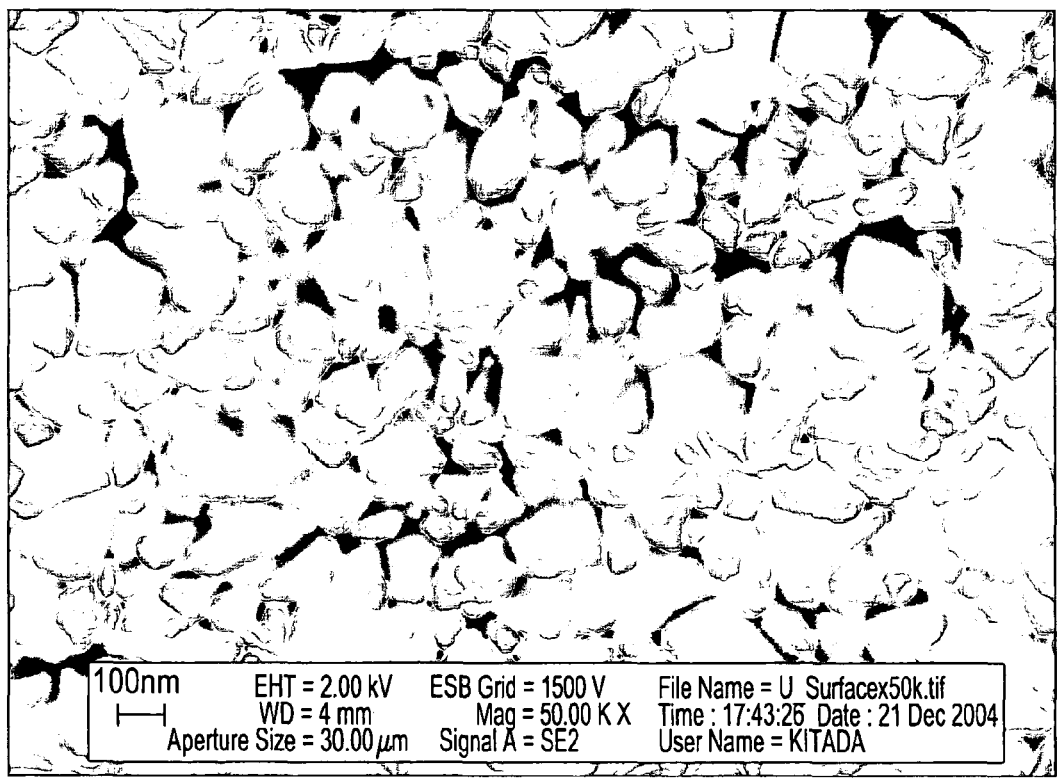
FIG. 14 is a surface SEM micrograph of the piezoelectric film of FIG. 13.

Generally, the surfaces of films of perovskite oxides are observed to have square shapes when the crystal are (100) oriented or (001) oriented, pyramidal shapes when the crystal are (111) oriented, and roof-like shapes when the crystal are (110) oriented. (See FIG. 14 presented for the comparison example explained later, in which the piezoelectric film is (100) oriented.) However, the end faces of the columnar crystals 17 at the surface 13s of the piezoelectric film 13 are irregular, and only 10% or less of the columnar crystals 17 have end faces with granular shapes similar to the columnar crystals in the conventional films of perovskite oxides.

The manner of formation of the piezoelectric film 13 is not specifically limited as long as the piezoelectric film 13 is formed by vapor phase deposition using plasma. For example, sputtering, ion beam sputtering, ion plating, plasma CVD, or the like can be used.

In the case where the piezoelectric film 13 is formed by the vapor phase deposition as above, it is preferable that the film-formation temperature is 400° C. or higher and lower than 550° C. It is difficult to stably grow perovskite crystals at the film-formation temperature lower than 400° C. In addition, in order to obtain the piezoelectric film 13 which is a columnar film constituted by a great number of columnar crystals having irregular end faces, the film-formation temperature is preferably lower than 550° C. Although it is possible to form a film having a perovskite structure even at the film-formation temperature of 550° C. or higher, piezoelectric films formed at relatively high film-formation temperature tend to have structures which are relatively stable at the film-formation temperature, and therefore the end faces of columnar crystals constituting the piezoelectric films formed at relatively high film-formation temperature tend to have relatively uniform diameters, and not to have irregular shapes.

Further, when a piezoelectric film is formed at the film-formation temperature of 550° C. or higher, the high film-formation temperature tends to increase the arithmetic average surface roughness Ra. When the film-formation temperature is further raised, loss of lead (Pb) is likely to occur, and cracks and the like are likely to be produced by the stress caused by the difference in the thermal expansion coefficient between the substrate 11 and the piezoelectric film 13. Therefore, it is difficult to form a piezoelectric film having satisfactory piezoelectric performance at the film-formation temperature of 550° C. or higher unless a process for varying the composition of the piezoelectric film along the thickness direction (as disclosed in JP3705089 or U.S. Pat. No. 7,145,285) or a similar process is performed.

Although the thickness of the piezoelectric film 13 is not specifically limited, it is generally more preferable that the thickness of the piezoelectric film 13 is smaller since the thickness reduction is demanded as mentioned before. However, in the case where the thickness of the piezoelectric film 13 is too small, the stress imposed from the interface between the substrate and the piezoelectric film impedes delivery of sufficient piezoelectric performance. Therefore, it is preferable that the thickness of the piezoelectric film 13 be 1 micrometer or greater.

The present inventors have found preferable that the ferroelectric film 13 be formed under a condition that the difference Vs–Vf between the plasma potential Vs in plasma generated during formation of the piezoelectric film and the floating potential Vf in the plasma generated during the formation of the piezoelectric film is in the range of 10 V to 30 V.

In this specification, it is assumed that the plasma potential Vs and the floating potential Vf are measured by the single-probe technique using the Langmuir probe. In order to prevent inclusion of errors caused by adhesion of a portion of a film being formed or the like to the probe, the tip of the probe is maintained in the vicinity of the substrate (for example, approximately 10 mm from the substrate) in the measurement, and the measurement is completed in the shortest possible time. The potential difference Vs–Vf between the plasma potential Vs and the floating potential Vf, measured in volts (V), can be directly converted into an electron temperature expressed in electron volts (eV), where 1 eV corresponds to 11,600 K (Kelvin).

Figure 3:
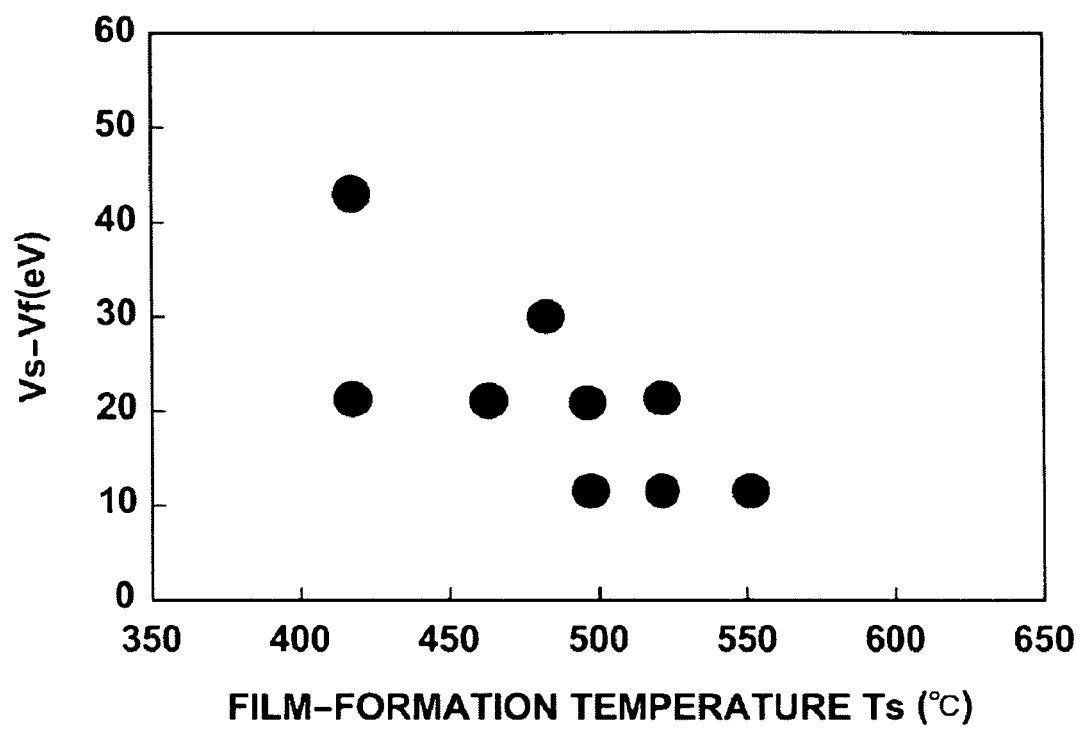
FIG. 3 is a diagram indicating observed combinations of values of the film-formation temperature Ts and the difference Vs−Vf which realize piezoelectric films having the features according to the present invention.

The present inventors have formed various piezoelectric films at various film-formation temperatures with different values of the difference Vs–Vf by using a target of PZT ($Pb_{1.3}Zr_{0.52}Ti_{0.48}O_3$) or Nb-PZT ($Pb_{1.3}Zr_{0.43}Ti_{0.44}Nb_{0.13}O_3$), and observed the surface shape of each piezoelectric film on the basis of an SEM micrograph of the piezoelectric film. FIG. 3 is a diagram indicating observed combinations of values of the film-formation temperature Ts and the difference Vs–Vf which realize piezoelectric films having the features according to the present invention.

In FIG. 3, each of the filled circles indicates a combination of values of the film-formation temperature and the difference Vs–Vf which realizes the piezoelectric film having the characteristic features of the present invention. The piezoelectric film formed under the condition corresponding to each of the combinations of values of the film-formation temperature Ts and the difference Vs–Vf has the arithmetic average surface roughness Ra of 10 nm or smaller and a distribution of the diameters of the minimum circumscribed circles of the end faces of the columnar crystals 17 observed at the surface 13s ranging from a value not exceeding 100 nm to a value of 500 nm or greater, where 20% or more of the columnar crystals 17 have end faces with the diameters of the minimum circumscribed circles not exceeding 100 nm, and 5% or more of the columnar crystals 17 have end faces with the diameters of the minimum circumscribed circles of 500 nm or greater. Specifically, in FIG. 3, the piezoelectric films indicated by the filled circles at the film-formation temperature of 525° C. are Nb-PZT (Nb-doped PZT) films, and the piezoelectric films indicated by the other filled circles are PZT films. The observation results indicated in FIG. 3 show that when the PZT films or Nb-PZT films are formed under the condition that the difference Vs–Vf is in the range of 10 V to 30 V and the film-formation temperature is 400° C. or higher and lower than 550° C., the end faces 17s of the columnar crystals 17 have irregular shapes as above.

It is generally known that although the formation temperature becomes as high as 800° C. or higher when bulk PZT ceramics are produced by a metallurgical process such as sintering, the formation temperature can be remarkably lowered when non-thermal equilibrium plasma is used as in sputtering. In the case where a piezoelectric film is formed at such a low temperature, the crystals or the internal structure of the piezoelectric film can be formed in a non-thermal equilibrium state, instead of a thermal equilibrium state as in the conventional metallurgical process. Therefore, it is possible to consider that the film formed at the temperature of 550° C. or lower has different properties from the bulk PZT ceramics produced by the metallurgical process.

Thus, the piezoelectric device 1 according to the present embodiment have the following advantages.

As explained above, the piezoelectric film 13 in the piezoelectric device 1 according to the present embodiment is formed by vapor phase deposition using plasma, the piezoelectric film 13 is a columnar film composed of one or more PZT-based perovskite oxides $Pb(Ti_x, Zr_y, M_z)O_3$, and constituted by a plurality of columnar crystals 17, where the diameters of the minimum circumscribed circles of the end faces 17s (observed at the surface 13s of the piezoelectric film 13) are distributed from a value not exceeding 100 nm to a value of 500 nm or greater, 20% or more of the plurality of columnar crystals 17 have end faces with the diameters of the minimum circumscribed circles not exceeding 100 nm, 5% or more of the plurality of columnar crystals 17 have end faces with the diameters of the minimum circumscribed circles of 500 nm or greater, and the columnar film has an arithmetic average surface roughness Ra of 10 nm or smaller.

Since the surface roughness of the piezoelectric film 13 is small, the electric fields are unlikely to concentrate, so that it is possible to suppress deterioration of the piezoelectric film 13, which can be caused by concentration of electric fields. In addition, since the small arithmetic average surface roughness Ra increases the precision in the patterning, which is performed in a later stage for completing the device, it is possible to improve the uniformity of the actuation over the entire area of the piezoelectric film.

Further, in the piezoelectric film 13 in the piezoelectric device 1, the diameters of the crystalline grains are widely distributed, and the crystalline grains constituting the entire piezoelectric film 13 have irregular shapes. Although the piezoelectric performance of crystalline grains having great diameters are generally considered likely to be limited by in-plane stress and the like, the piezoelectric performance of the piezoelectric film 13 as a whole is not limited since the crystalline grains having small diameters are mixed with the crystalline grains having great diameters, and therefore the stress can be easily relaxed.

Further, since the diameters of the crystalline grains constituting the piezoelectric film 13 in the piezoelectric device 1 according to the present embodiment are not uniform, the complex processes for producing the variations of the composition of the piezoelectric film along the thickness direction and arranging the orientation control layer are unnecessary.

Therefore, the piezoelectric device 1 according to the present embodiment can be produced by vapor phase deposition using plasma, so that the piezoelectric device 1 can be produced by a simple process, and exhibits high reliability and satisfactory piezoelectric performance.

2. INKJET RECORDING APPARATUS

Figure 4:
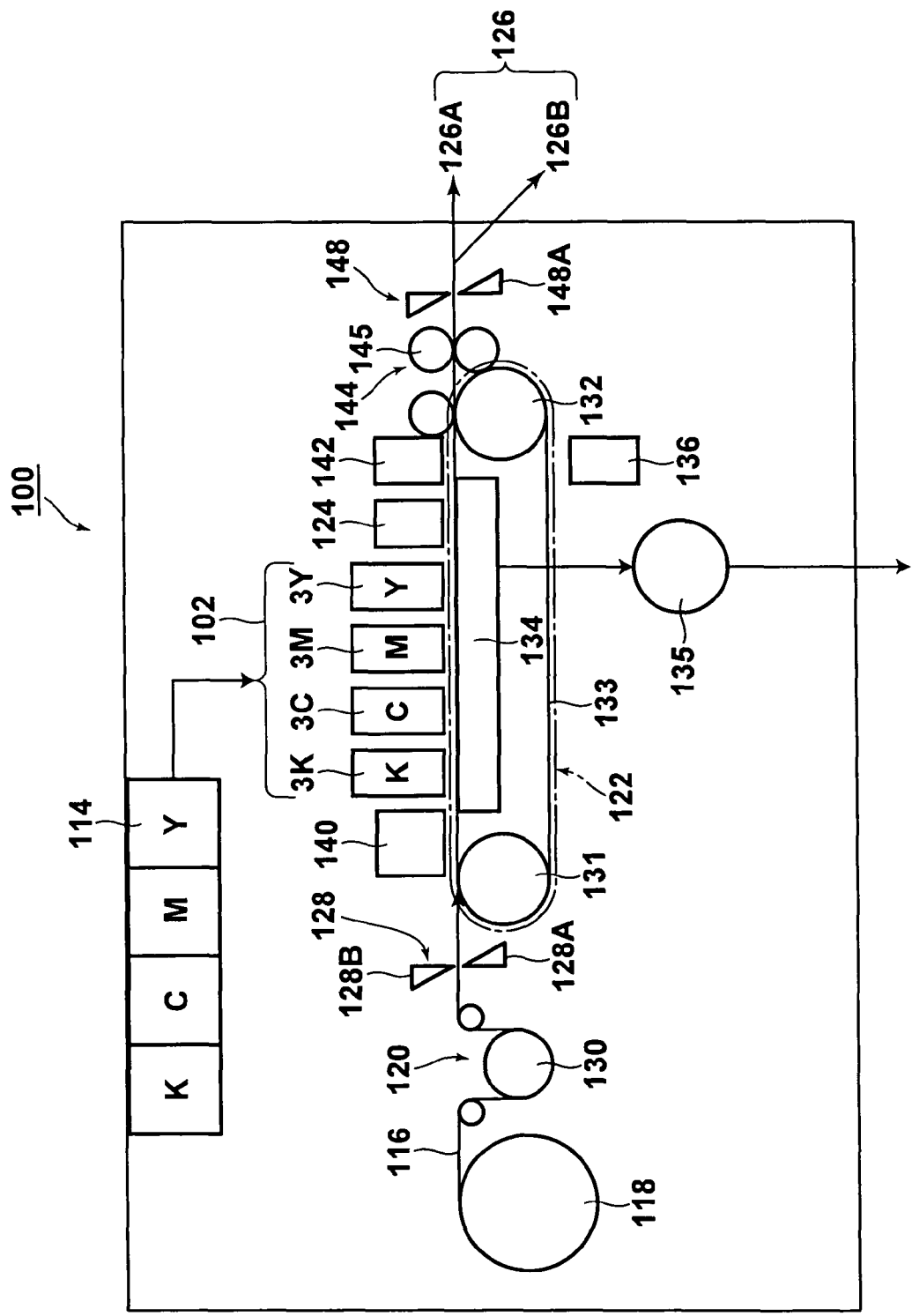
FIG. 4 is a schematic diagram of an example of an inkjet recording apparatus using the inkjet recording head of FIG. 1.
Figure 5:
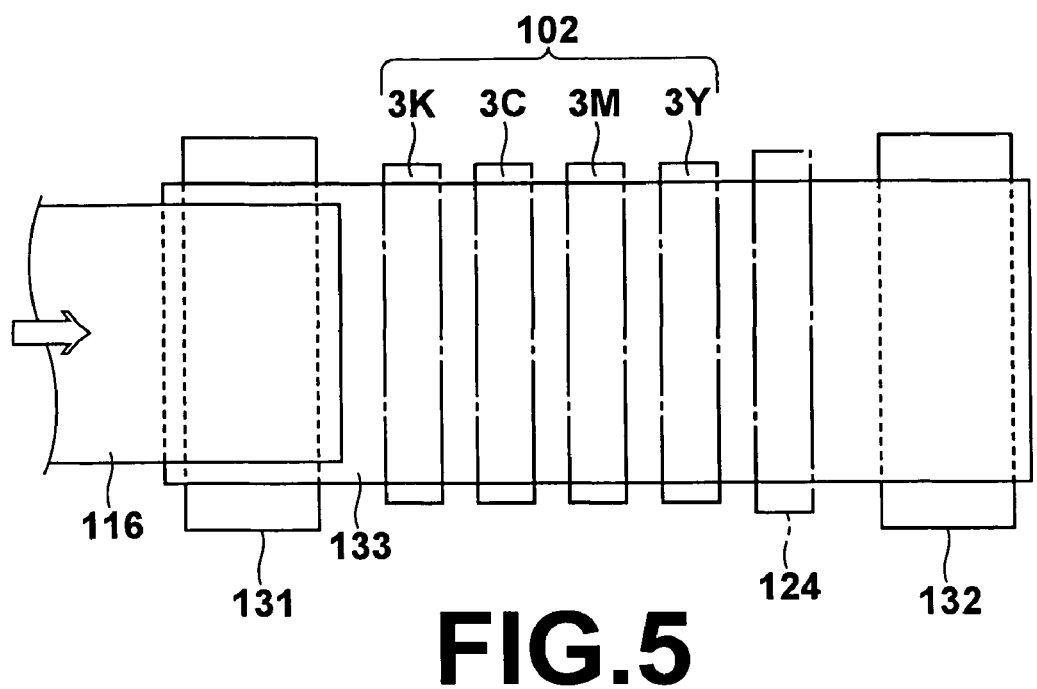
FIG. 5 is a top view of a portion of the inkjet recording apparatus of FIG. 4.

Hereinbelow, an example of an inkjet recording apparatus having the inkjet recording head 3 is explained with reference to FIGS. 4 and 5. FIG. 4 is a schematic diagram illustrating an outline of an example of an inkjet recording apparatus having the inkjet recording head 3 of FIG. 1, and FIG. 5 is a top view of a portion of the inkjet recording apparatus of FIG. 4.

As schematically illustrated in FIG. 4, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness at the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head 3 according to the present embodiment as explained before. In order to realize a linear head (explained later), each inkjet recording head used in the inkjet recording apparatus 100 comprises a plurality of ink chambers and a plurality of ink-discharge outlets.

The decurling wait 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120 as illustrated in FIG. 4. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 4, and the recording sheet 116 held on the endless belt 133 is moved from left to right in FIG. 4.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 5. Specifically, each of the heads 3K, 3C, 3M, and 3Y is a linear head in which the aforementioned plurality of ink-discharge outlets (nozzles) are arrayed over a length exceeding the maxim length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 5. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises a pressure roller 145 having a surface having predetermined projections and depressions, and transfers the predetermined projections and depressions to the printed surface of the recording sheet 116 by pressing the printed surface with the pressure roller 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

3. EVALUATION OF CONCRETE EXAMPLE

The present inventors have produced a preferable concrete example and a comparison example of the piezoelectric device according to the present invention as indicated below.

3.1 Concrete Example

The concrete example of the piezoelectric device according to the present invention has been produced as follows.

In the first stage of the process of producing the concrete example of the piezoelectric device, an adhesion layer of titanium (Ti) having a thickness of 10 nm and a lower electrode layer of iridium (Ir) having a thickness of 150 nm have been formed in this order on a SOT (silicon-on-insulator) substrate with a diameter of 6 inches by sputtering at the substrate temperature of 350° C.

Then, a piezoelectric film of Nb-PZT (Nb-doped PZT) having a thickness of 4 micrometers has been formed by sputtering at the film-formation temperature of 480° C. in the atmosphere of a gas mixture of Ar and 1.0 volume percent $O_2$ with the vacuum degree of 0.5 Pa. At this time, a target of $(Pb_{1.3}(Zr_{0.52}Ti_{0.48})_{0.90}Nb_{0.10}O_3)$ has been used, the substrate has been held in a floating state, a ground (earth) has been arranged apart from the substrate outside the space between the substrate and the target, the input power is 200 W, and the substrate-target distance is 60 mm. In addition, the plasma potential Vs and the floating potential Vf (in the vicinity of the substrate approximately 10 mm from the substrate) have been measured, and the difference Vs–Vf between the plasma potential and the floating potential has been obtained as approximately 30 V.

Figure 6:
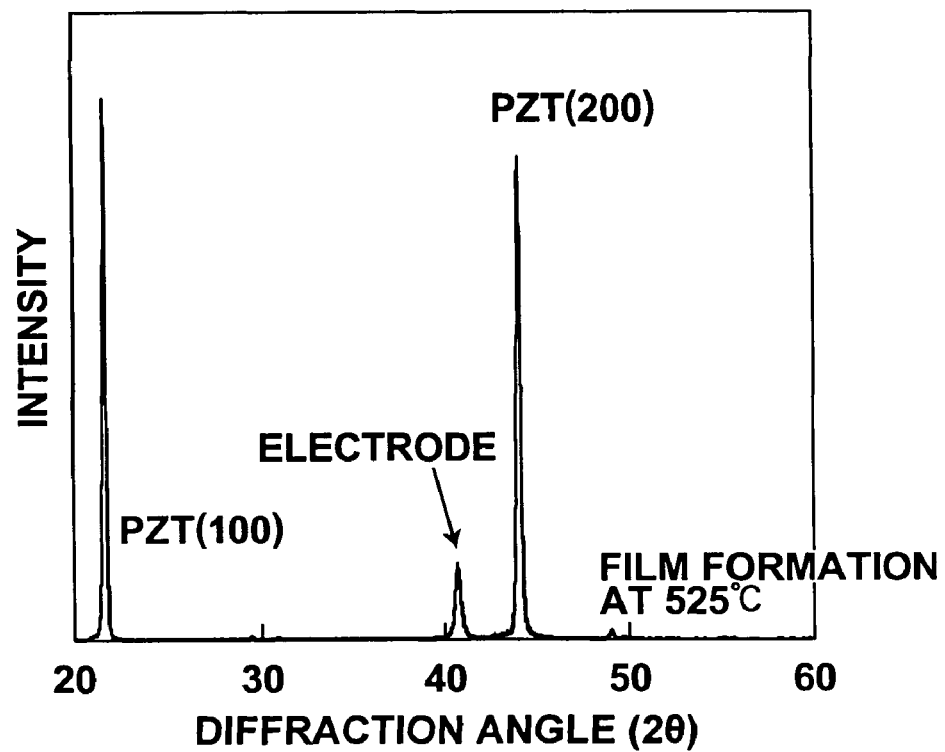
FIG. 6 is an XRD (X-ray Diffraction) profile of a piezoelectric film obtained in a concrete example of the present invention.
Figure 9:
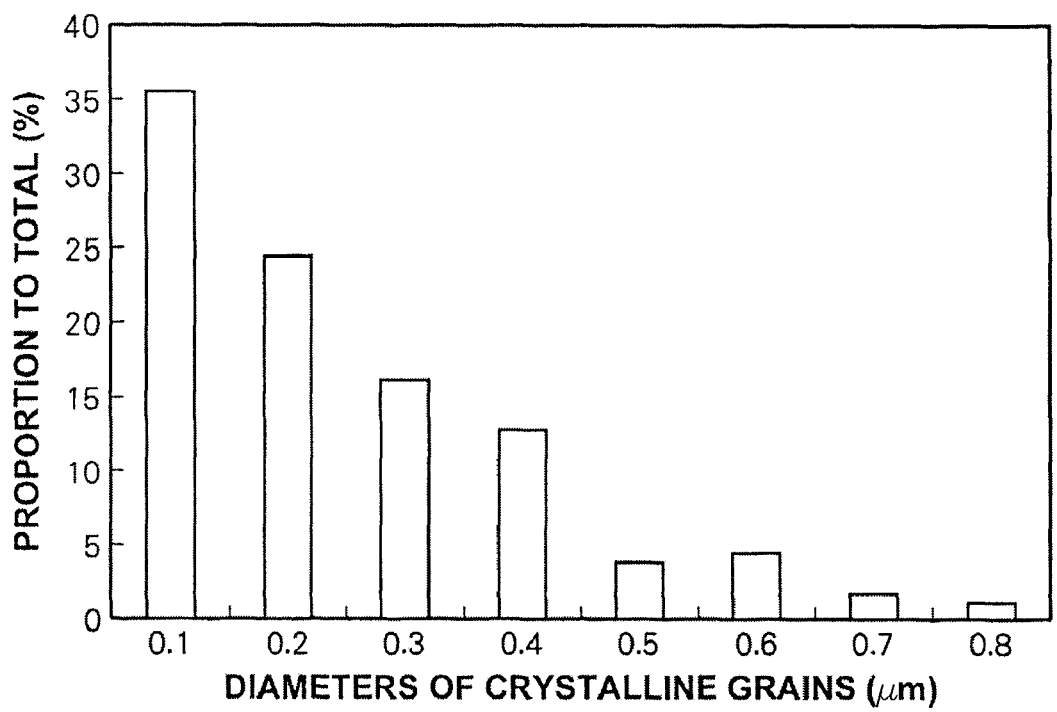
FIG. 9 is a diagram indicating the distribution of the diameters of the crystalline grains at the surface of the piezoelectric film, which is obtained by analysis of the surface SEM image of FIG. 7.

FIG. 6 shows an XRD (X-ray Diffraction) profile of the above piezoelectric film, and FIG. 7 shows a surface SEM (Scanning Electron Microscope) micrograph of the piezoelectric film. In addition, in order to clearly observe the crystalline grains, an image of crystalline grains at a surface of the above piezoelectric film has been obtained by EBSD (Electron Backscatter Diffraction) measurement of the surface as shown in FIG. 8. As understood from the XRD profile of FIG. 6, the piezoelectric film obtained as above is a (100) preferentially oriented, single-phase perovskite film (with the degree of orientation of 90% or higher). The surface SEM micrograph of FIG. 7 and the EBSD image of FIG. 8 indicate that the piezoelectric film obtained as above has an approximately flat surface. Further, the dimensions of the crystalline grains at the surface of the piezoelectric film have been measured within a field of vision, and the diameters of the minimum circumscribed circles of the crystalline grains have been observed to widely range from 50 nm to 1200 nm. FIG. 9 shows the distribution of the diameters of the crystalline grains at the surface of the piezoelectric film, where the diameters of the crystalline grains are the diameters of the minimum circumscribed circles of the crystalline grains obtained as above.

Figure 10:
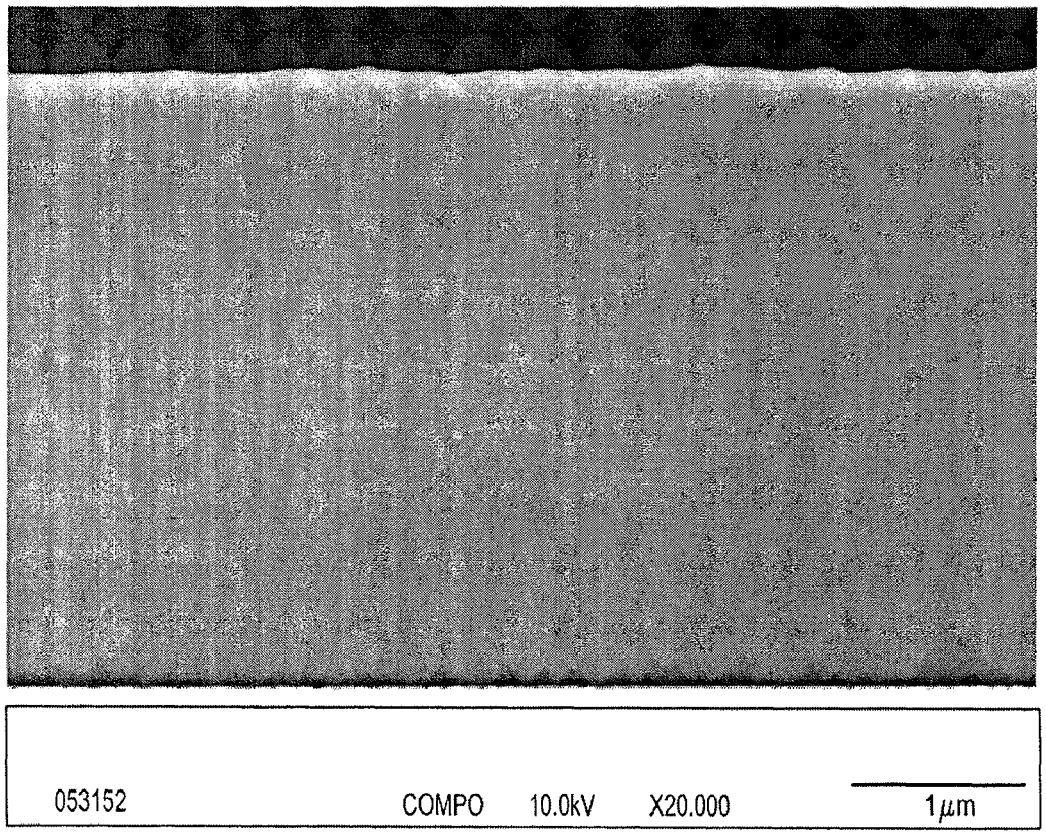
FIG. 10 is a cross-sectional SEM micrograph of a cross section, along the thickness direction, of the piezoelectric film of FIG. 6.
Figure 11:
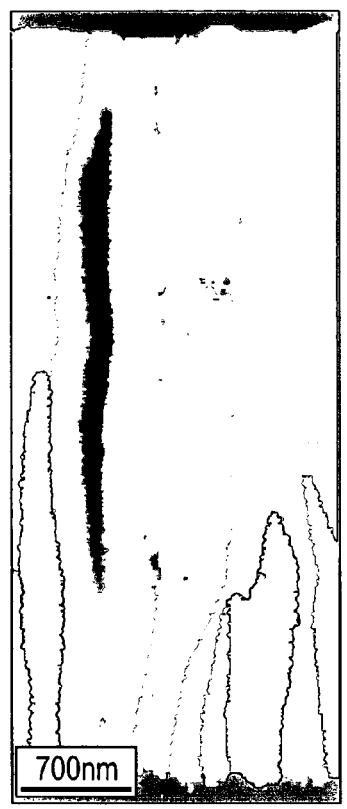
FIG. 11 is an image of crystalline grains at the cross section of FIG. 10, which is obtained by EBSD measurement of the cross section of FIG. 10.

Further, FIG. 10 is a cross-sectional SEM micrograph of a cross section, along the thickness direction, of the piezoelectric film of FIG. 6, and FIG. 11 is an image of crystalline grains at the cross section of FIG. 10, which is obtained by EBSD measurement of the cross section of FIG. 10. FIGS. 10 and 11 indicate that the crystalline grains in the above piezoelectric film are columnar crystals. In addition, the arithmetic average surface roughness Ra of the piezoelectric film has been measured by using a surface profiler in accordance with the JIS (Japanese Industrial Standard) B0601-1994, and the obtained value of the arithmetic average surface roughness Ra is 5.3 nm, which is satisfactory.

After the formation of the Nb-PZT piezoelectric film, an upper electrode of platinum (Pt) having a thickness of 100 nm has been formed by sputtering, and patterned by liftoff. In addition, the back surface of the SOI substrate has been processed by dry etching so as to produce an ink chamber 500 micrometers square, and the substrate has been processed or machined so as to produce a diaphragm having a thickness of 6 micrometers and an ink nozzle containing the ink chamber and an ink-discharge outlet. Thus, production of an inkjet recording head containing the concrete example of the piezoelectric device according to the present invention has been completed.

Figure 12:
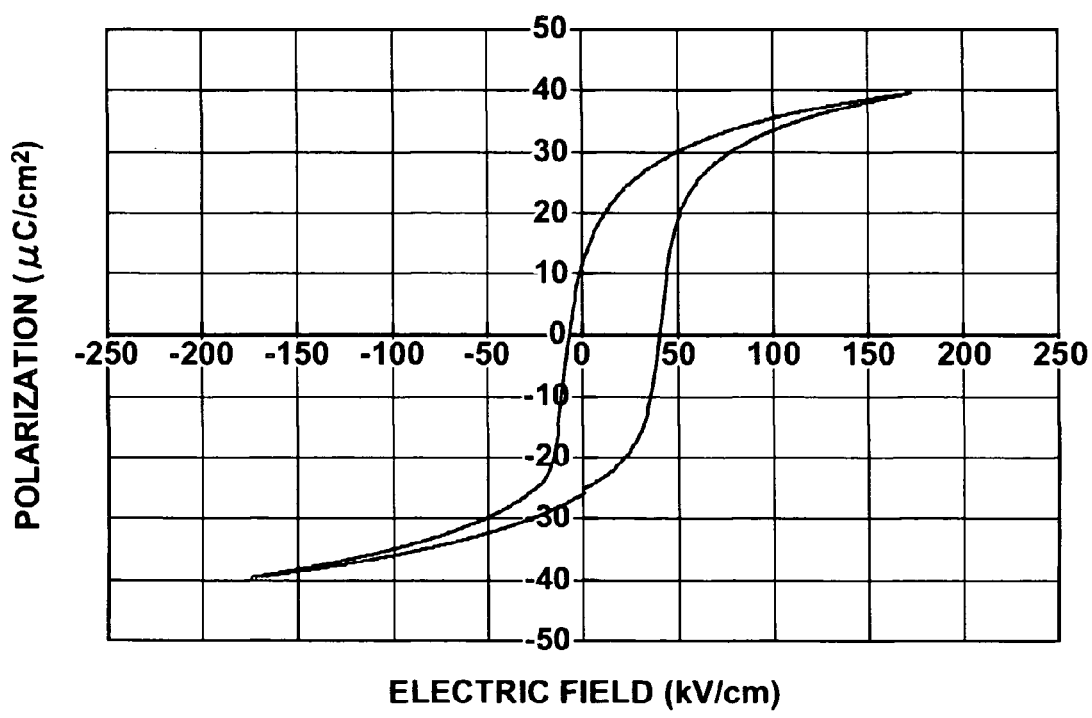
FIG. 12 is a polarization-electric hysteresis curve of the piezoelectric film of FIG. 6.

The P-E (polarization-electric field) hysteresis characteristic of the piezoelectric device in the concrete example has been measured by applying to the piezoelectric device an electric field at the frequency of 5 Hz with the maximum electric field strength of 170 kV/cm. FIG. 12 is the P-B hysteresis curve of the piezoelectric film. The polarization-electric hysteresis curve of FIG. 12 indicates that the above piezoelectric film exhibits satisfactory ferroelectric performance.

In addition, the displacement of the piezoelectric film in the concrete example has been measured by using a laser Doppler vibrometer, and the piezoelectric constant has been calculated by using the structural analysis software "ANSYS." In the calculation, the Young's modulus obtained on the basis of the resonance frequency is set to 50 MPa. The obtained piezoelectric constant $d_{31}$ is 260 pm/V. That is, the piezoelectric film in the concrete example exhibits satisfactory piezoelectric performance. Further, a long-term operation test of the above piezoelectric film has been performed at the temperature of 40° C. and the relative humidity of 80% RH, and no change has been found in the displacement (strain) even after actuation of a hundred billion dots. That is, the piezoelectric film in the concrete example exhibits satisfactory durability.

3.2 Comparison Example

The comparison example of the piezoelectric device according to the present invention is produced in a similar manner to the concrete example except that the Nb-PZT film is formed at the film-formation temperature of 550° C. The piezoelectric film in the piezoelectric device in the comparison example has been evaluated on the basis of an XRD result and a surface SEM image which are obtained in similar manners to the concrete example.

Figure 13:
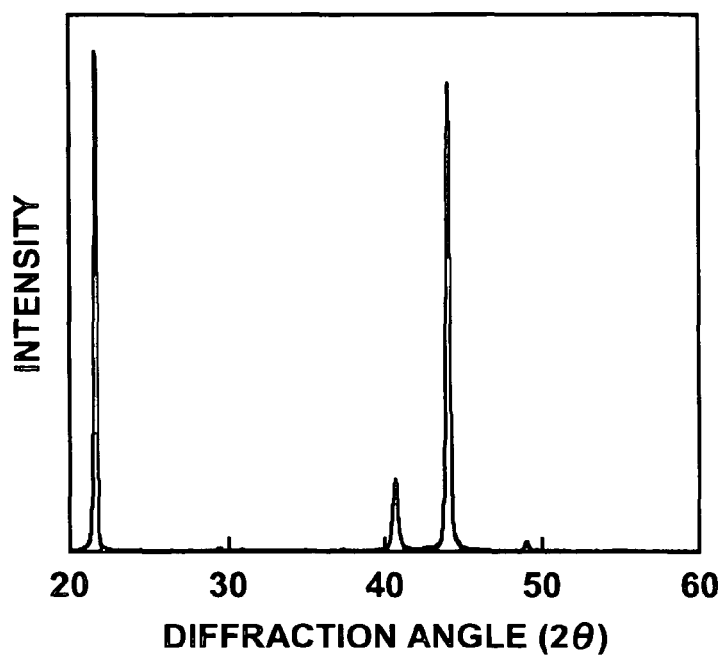
FIG. 13 is an XRD profile of a piezoelectric film obtained in a comparison example.

FIG. 13 shows an XRD profile of the above piezoelectric film, and FIG. 14 shows a surface SEM micrograph of the piezoelectric film. As understood from the XRD profile of FIG. 13, the piezoelectric film obtained as above is a (100) preferentially oriented, single-phase perovskite film (with the degree of orientation of 90% or higher). However, in the surface SEM micrograph of FIG. 14, approximately 3% to 5% of columnar crystals constituting the piezoelectric film in the comparison example and existing in a field of vision have been observed to have square shapes, pyramidal shapes, or roof-like shapes, which are generally observed in the surfaces of the conventional films of perovskite oxides.

In addition, the dimensions of the crystalline grains at the surface of the piezoelectric film in the comparison example have been measured, and the diameters of the minimum circumscribed circles of the crystalline grains in the field of vision have been observed to be in the range of 20 to 300 nm. That is, the diameters of the crystalline grains are distributed within a relatively narrow range.

After the formation of the above piezoelectric film, an upper electrode of platinum (Pt) has been formed, and then a diaphragm having a thickness of 6 micrometers and an ink nozzle containing the ink chamber 500 micrometers square and an ink-discharge outlet have been formed, in similar manners to the concrete example. Thus, production of an inkjet recording head containing the comparison example of the piezoelectric device according to the present invention has been completed.

Figure 15:
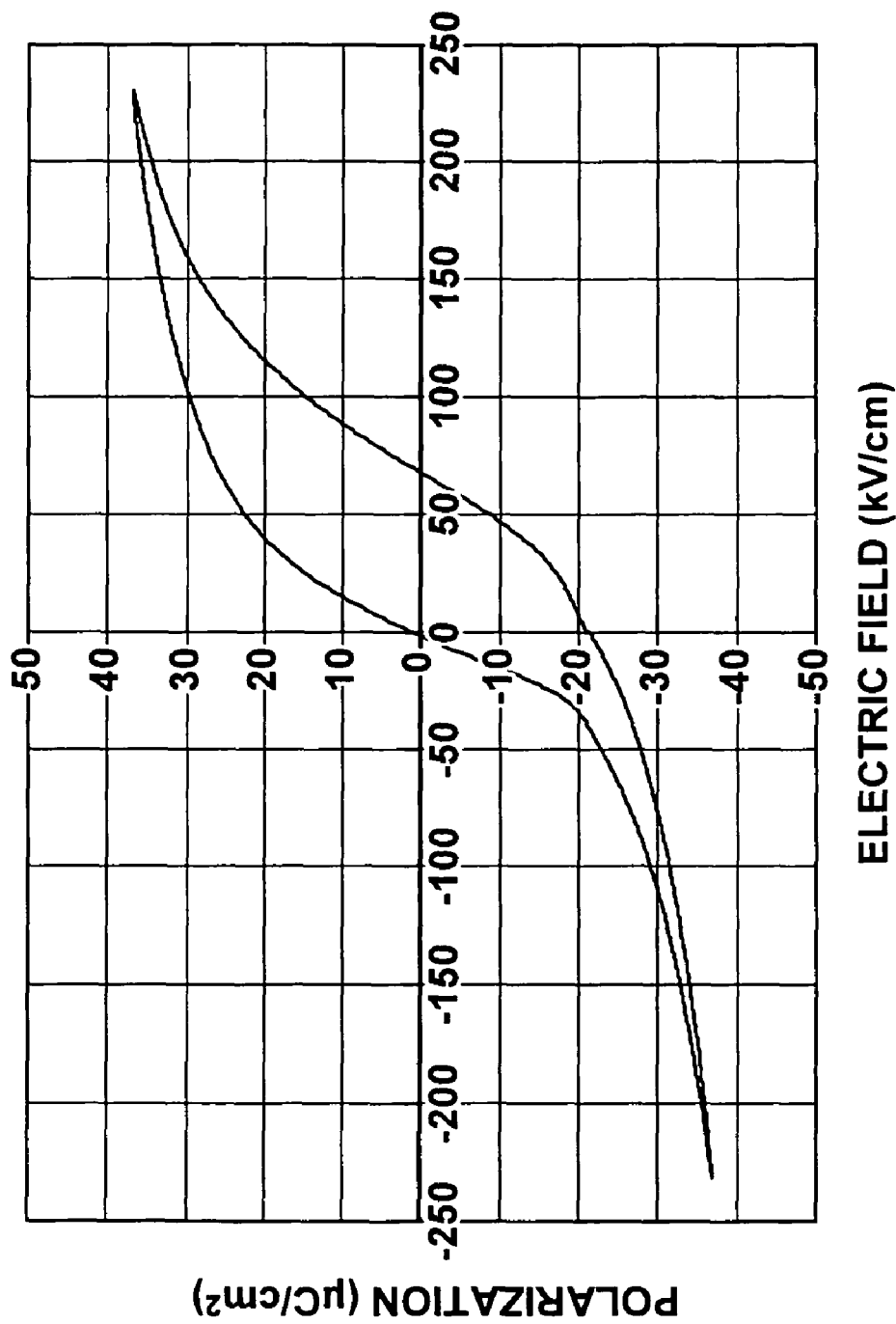
FIG. 15 is a polarization-electric hysteresis curve of the piezoelectric film of FIG. 13.

Further, the P-E (polarization-electric field) hysteresis characteristic of the piezoelectric device in the comparison example has been measured in a similar manner to the concrete example. FIG. 15 is the P-E hysteresis curve of the piezoelectric film in the comparison example. The polarization-electric hysteresis curve of FIG. 15 indicates that the above piezoelectric film in the comparison example exhibits satisfactory ferroelectric performance.

Furthermore, the displacement of the piezoelectric film in the comparison example has been measured by using the laser Doppler vibrometer, and the piezoelectric constant has been calculated by using the structural analysis software "ANSYS." In the calculation, the Young's modulus obtained on the basis of the resonance frequency is set to 50 MPa. The obtained piezoelectric constant $d_{31}$ is 160 pm/V. That is, the piezoelectric constant d31 of the piezoelectric film in the comparison example is smaller than the piezoelectric constant d31 of the piezoelectric film in the concrete example.

4. INDUSTRIAL USABILITY

The piezoelectric device according to the present invention can be preferably used in piezoelectric actuators, and the like, where the piezoelectric actuators may be mounted in the inkjet recording heads, the magnetic recording-and-reproduction heads, MEMS (micro electromechanical systems) devices, micropumps, ultrasonic probes, and the like. In addition, the process for forming the piezoelectric film used in the process for producing the piezoelectric device according to present invention can be preferably used in formation of a ferroelectric film in ferroelectric memories (FRAMs).

What is claimed is:

1. A piezoelectric device comprising:
   a substrate having a surface;
   an electrode formed over said surface of the substrate; and
   a piezoelectric film formed over said surface of the substrate through said electrode by vapor phase deposition using plasma;
   wherein said piezoelectric film is a columnar film constituted by a plurality of columnar crystals which are composed of one or more perovskite oxides and inevitable impurities, and extend nonparallel to said surface of the substrate, each of the one or more perovskite oxides is expressed by a compositional formula $Pb(Ti_x, Zr_y, M_z)O_3$, M in the compositional formula represents one or more of metal elements Sn, Nb, Ta, Mo, W, Ir, Os, Pd, Pt, Re, Mn, Co, Ni, V, and Fe, $0<x<1$, $0<y<1$, $0\leq z<1$, and $x+y+z=1$,
   said plurality of columnar crystals have end faces at a surface of said columnar film, and 20% or more of the plurality of columnar crystals have end faces with diameters of minimum circumscribed circles not exceeding 100 nm, and 5% or more of the plurality of columnar crystals have end faces with diameters of minimum circumscribed circles of 500 nm or greater, and
   said columnar film has an arithmetic average surface roughness of 10 nm or smaller.

2. A piezoelectric device according to claim 1, wherein said piezoelectric film is formed at a film-formation temperature lower than 550° C. by said vapor phase deposition.

3. A piezoelectric device according to claim 1, wherein said piezoelectric film is formed under a condition that the difference between a plasma potential Vs in plasma generated during formation of the piezoelectric film and a floating potential Vf in the plasma generated during the formation of the piezoelectric film is in a range of 10 V to 30 V.

4. A piezoelectric device according to claim 1, wherein said vapor phase deposition is realized by one of sputtering, ion plating, and plasma CVD.

5. A piezoelectric device according to claim 1, wherein said piezoelectric film has a thickness of 1 micrometer or greater.

6. A liquid discharge device comprising:
   said piezoelectric device according to claim 1; and
   a discharge member being formed integrally with or separately from said substrate in the piezoelectric device, and including,
   a liquid-reserve chamber which reserves liquid, and
   a liquid-discharge outlet through which said liquid is externally discharged from the liquid-reserve chamber.

* * * * *